(12) United States Patent
Hara et al.

(10) Patent No.: US 8,035,989 B2
(45) Date of Patent: Oct. 11, 2011

(54) ELECTRONIC DEVICE CHASSIS AND CANISTER

(75) Inventors: Tsutomu Hara, Yokohama (JP); Junichi Funatsu, Isehara (JP); Toshihiro Ishiki, Ebina (JP)

(73) Assignee: Hitachi, Ltd., Tokyo (JP)

( * ) Notice: Subject to any disclaimer, the term of this patent is extended or adjusted under 35 U.S.C. 154(b) by 788 days.

(21) Appl. No.: 12/155,802

(22) Filed: Jun. 10, 2008

(65) Prior Publication Data

US 2008/0316682 A1    Dec. 25, 2008

(30) Foreign Application Priority Data

Jun. 15, 2007 (JP) ................................. 2007-158150

(51) Int. Cl.
*H05K 9/00* (2006.01)
(52) U.S. Cl. .......................... 361/816; 361/818; 361/800
(58) Field of Classification Search .......... 361/801–803, 361/756, 799, 816, 818, 727, 730, 752, 796, 361/800; 312/223.1, 223.2; 174/35 R, 51, 174/350
See application file for complete search history.

(56) References Cited

U.S. PATENT DOCUMENTS

| | | | | |
|---|---|---|---|---|
| 6,088,222 A | * | 7/2000 | Schmitt et al. | 361/679.33 |
| 6,556,432 B2 | * | 4/2003 | Chen et al. | 361/679.33 |
| 6,608,750 B2 | * | 8/2003 | Cruz et al. | 361/679.33 |
| 6,879,495 B2 | * | 4/2005 | Jiang | 361/818 |
| 7,457,134 B2 | * | 11/2008 | Ice | 361/816 |
| 7,924,557 B2 | * | 4/2011 | Li | 361/679.37 |

FOREIGN PATENT DOCUMENTS

| | | |
|---|---|---|
| JP | 09-074293 | 3/1997 |
| JP | 2002-290077 | 10/2002 |
| JP | 2003-152359 | 5/2003 |
| JP | 2007-109985 | 4/2007 |

* cited by examiner

*Primary Examiner* — Hung S Bui
(74) *Attorney, Agent, or Firm* — Antonelli, Terry, Stout & Kraus, LLP.

(57) ABSTRACT

In the invention, a finger board is bent like a "letter V", and a thickness adjustment plate is provided between the finger boards of modules to be able to move, thereby being able to adjust the height of a finger. Such a configuration enables to increase the contact pressure of the finger by increasing the height of the finger when the finger is inserted, and when the finger is detached, reduce the contact pressure by reducing the height of the finger. This accordingly provides a shield chassis of suppressing any possible noise with no loss of insertability/removability.

14 Claims, 9 Drawing Sheets

ATTACHMENT OF CANISTER

DETACHMENT OF CANISTER

PATA HDD
TRANSMISSION
SPEED 133 MHz

SATA HDD
TRANSMISSION
SPEED 3 GHz

100mm=1λ@3GHz

RESONANCE SIMULATION OF HDD

NO MEASURE
AGAINST CANISTER

CANISTER OF
THE INVENTION

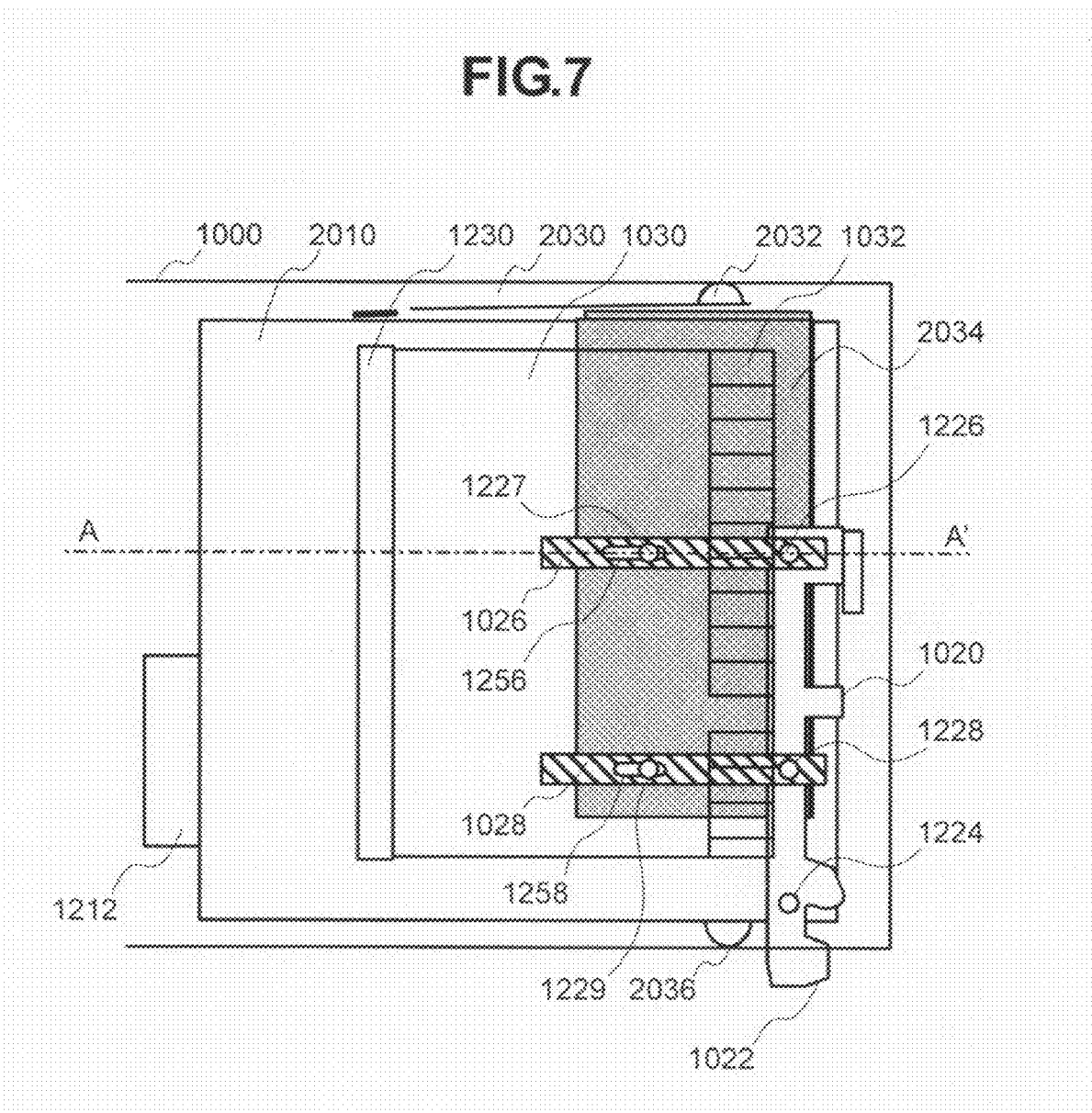

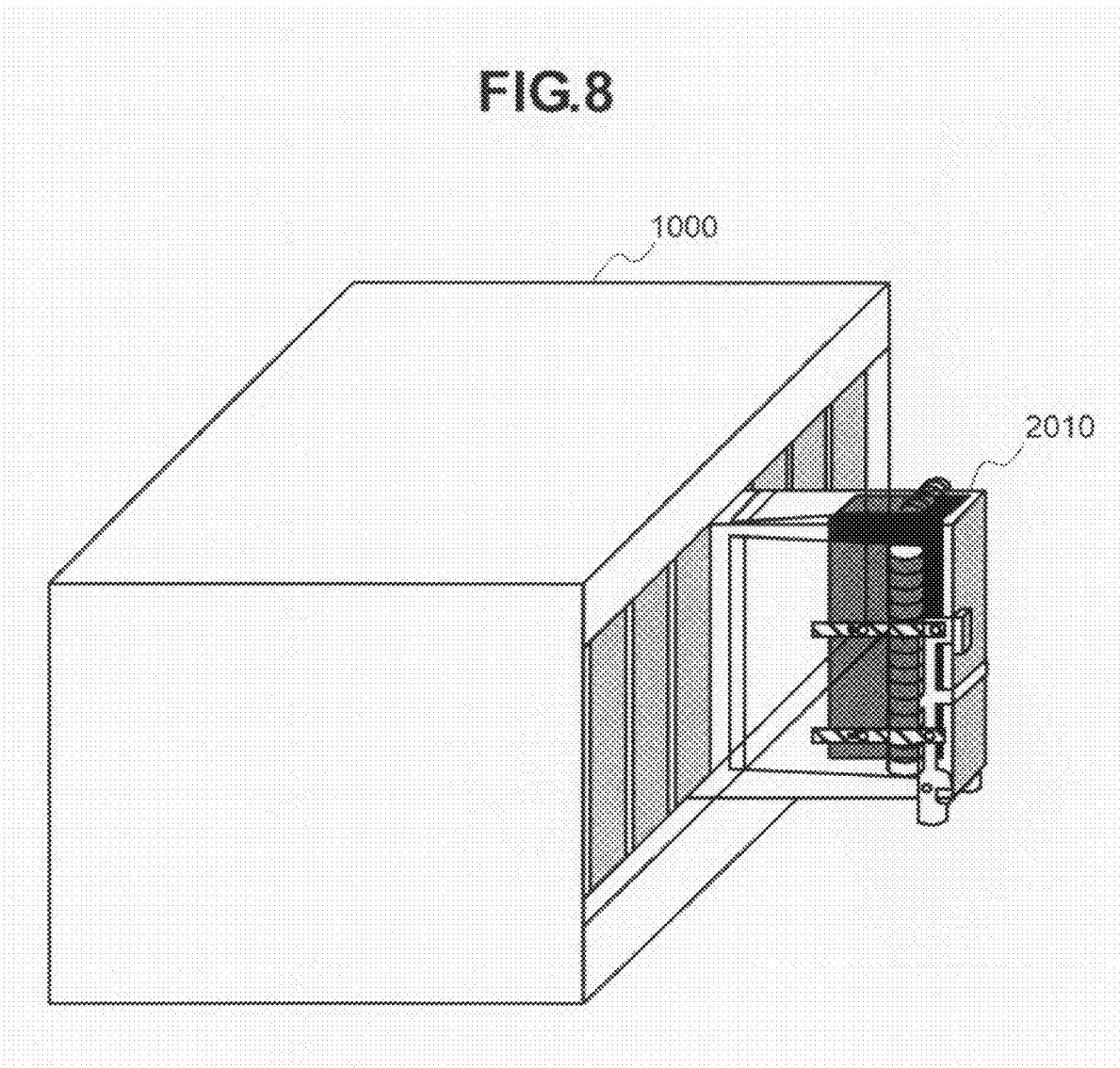

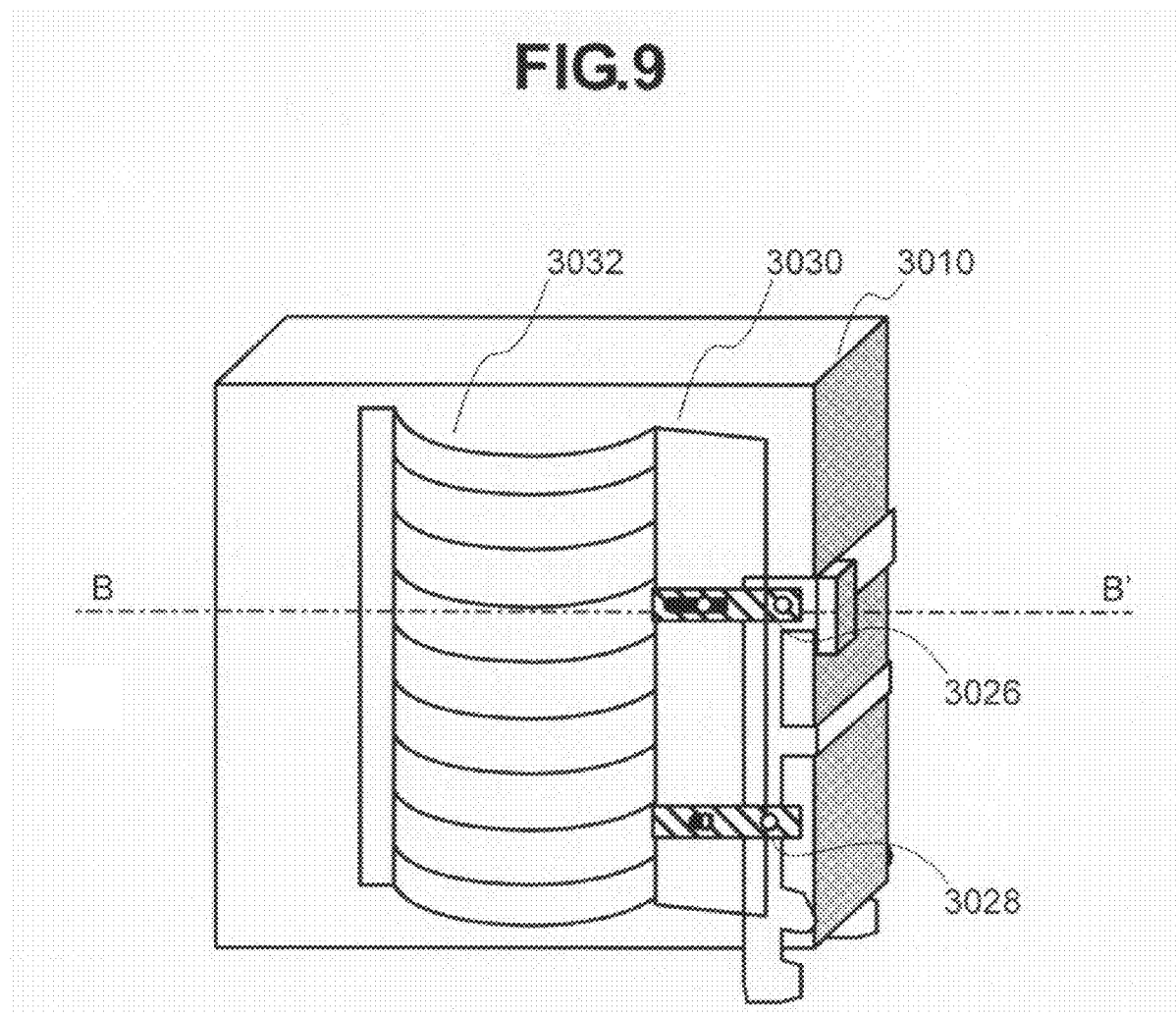

ATTACHMENT OF CANISTER

DETACHMENT OF CANISTER

ELECTRONIC DEVICE CHASSIS AND CANISTER

CLAIM OF PRIORITY

The present application claims priority from Japanese application serial no. JP2007-158150, filed on Jun. 15, 2007, the content of which is hereby incorporated by reference into this application.

BACKGROUND OF THE INVENTION

1. Field of the Invention

The present invention relates to a chassis of an electronic device handling high-speed signals and a canister to be housed in the chassis of the electronic device, and also relates to a packaging method of suppressing any noise emission (ElectroMagnetic Compatibility: EMC).

2. Description of Related Art

Electronic devices handling high-speed digital signals emission noise due to clock signals and data signals showing a change in synchronization with the clock signals. This noise emission affects television receivers, radios, and others, and thus is under the control of standards institutions and nations in terms of measurement method and amount of emission. The standards institutions include CISPR (International Special Committee on Radio Interference), VCCI (Voluntary Control Council for Interference), and FCC (Federal Communications Commission), for example.

For the purpose of suppressing such noise emission, the electronic devices are of the shield configuration with the chassis made of conductor. The issue here is that the chassis is formed with a slot to enable easy insertion and removal of a hard disk canister and a printed wiring board. When this slot is inserted with a canister or a printed wiring board, a structural gap is created between the canister and another canister or between the printed wiring board and another printed wiring board. In consideration thereof, Patent Document 1 (JP-A-2003-152359) describes the configuration of filling such a gap between canisters by providing a conductive finger of the spring configuration to each of the canisters.

SUMMARY OF THE INVENTION

The problem with such a configuration of Patent Document 1, i.e., a conductive finger of the spring configuration is provided for filling a gap between canisters, is that the contact portion between the conductors will show a change of impedance depending on the state of contact. Due to the resulting variation of impedance, the shielding effects cannot be of the sufficient level. As to the contact pressure of the portion of the spring, lower is better for the insertability and removability of the canister.

In consideration thereof, for increasing the insertability and removability of the portions of the canisters, there is a possibility of reducing the height of the spring to reduce the contact pressure. With such height reduction, the handling such as the insertability and removability is indeed increased but the contact portion is increased in impedance, thereby failing to achieve the sufficient level of shielding effect. On the other hand, when the contact pressure is increased by increasing the height of the spring, the contact portion is reduced in impedance so that the shielding characteristics can be of the sufficient level. However, the handling such as the insertability and removability is reduced, thereby leading to the risk of damage to the components and the chassis.

As such, to study the possibility of filling the gap using the finger as measures against EMI (Electromagnetic Interference), there thus needs to optimize the pressure of the spring, and the optimization problematically requires a long time. Moreover, processing and attachment of the finger also requires the accuracy, thereby resulting in the increase of cost.

In consideration thereof, the invention proposes to reduce noise emission without loss of operability by providing, to modules such as canister and printed circuit that are insertable/removable, a finger that can establish a low-impedance gap connection between the modules when it is attached, and reduce the contact pressure when it is detached.

The general outline of typical aspects of the invention of this application is briefly given as below.

1. In the invention, an insertable/removable module is of the configuration including a conductive finger of the spring configuration, and a mechanism for adjusting the height of the finger. In the configuration, when the finger is attached, the height of the finger is increased, and when the finger is detached, the height of the finger is reduced.

2. In order to achieve the object above, in the invention, an insertable/removable module is provided with a conductive finger of the spring configuration that is connected with the module at least at a portion. The module is of the configuration with which, when the module is inserted/removed into/from the finger, the amount of movement of the module is converted into the movement in a direction vertical to the direction of insertion/removal.

3. In the configuration with which the amount of movement of the module in the direction of insertion/removal is converted into the movement in a direction vertical thereto, the finger is fixed to one side of the module so as to be tapered, and from the side opposite to the fixed side, a thin plate is so inserted as to be able to move.

4. Also in the configuration with which the amount of movement of the module in the direction of insertion/removal is converted into the movement in a direction vertical thereto, the finger is fixed to one side of the module like an arc, and the side opposite to the fixed side is allowed to move in the direction of insertion/removal.

5. The module configuration characterized by including: a canister; an attachment/detachment mechanism connected to the canister to be able to move forward and backward with respect to a first surface of the canister; and a first conductive member connected to a second surface of the canister adjacent to the first surface thereof. The first conductive member is provided to at least partially move forward and backward with respect to the second surface in response to the attachment/detachment mechanism moving forward and backward with respect to the first surface.

6. The module configuration of the fifth aspect is also characterized by further including a first member between the canister and the first conductive member. The first member is connected to the attachment/detachment mechanism, and is provided to move forward and backward with respect to the first surface in response to the attachment/detachment mechanism moving forward and backward with respect to the first surface.

7. The module configuration of the fifth or sixth aspect is also characterized by further including a second conductive member connected to a third surface that is adjacent to both the first and second surfaces of the canister.

8. The module configuration of any one of the fifth to seventh aspects is also characterized in that the first conductive member is partially protruding to an underside of a surface opposing the canister.

9. The module configuration of the fifth aspect is also characterized in that the first conductive member is connected also to the attachment/detachment mechanism.

10. The module configuration of the ninth aspect is also characterized in that the first conductive member has a curved portion between a portion connected with the canister and a portion connected with the attachment/detachment mechanism.

11. An electronic device including a chassis carrying therein a plurality of module configurations. The module configurations are each characterized by including: a canister; an attachment/detachment mechanism connected to the canister to be able to move forward and backward with respect to a first surface of the canister; and a first conductive member connected to a second surface of the canister adjacent to the first surface thereof. The first conductive member is provided to at least partially come in contact with any adjacent module configuration by moving forward and backward with respect to the second surface in response to the attachment/detachment mechanism moving forward and backward with respect to the first surface.

12. The electronic device of the eleventh aspect is also characterized by further including a second conductive member provided to come in contact with the chassis through a connection with a third surface that is adjacent to both the first and second surfaces of the canister.

13. The electronic device of the twelfth aspect is also characterized by further including a third conductive member provided to come in contact with the chassis through a connection with a fourth surface that is adjacent to both the first and second surfaces of the canister, and is different from the third surface.

14. The electronic device of any one of the eleventh to thirteenth aspects is also characterized in that the attachment/detachment mechanism is provided with a lug for engagement with a hole formed to the chassis.

These and other objects, features and advantages of the invention will be apparent from the following more particular description of preferred embodiments of the invention, as illustrated in the accompanying drawings.

BRIEF DESCRIPTION OF THE DRAWINGS

FIG. 7 is another diagram showing the configuration of the canister of the invention;

FIG. 8 is another diagram showing the configuration of the server device implementing the invention;

FIG. 9 is another diagram showing the mechanism of the canister of the invention.

DESCRIPTION OF THE PREFERRED EMBODIMENTS

In the invention, moreover, it is preferable to attach a mechanism and a finger onto two surfaces of a module being vertical to a surface to/from which the finger is inserted/removed. The mechanism is the one for converting the amount of movement of the module in the direction of insertion/removal into the movement in the direction vertical thereto.

First Embodiment

In the below, a first embodiment of the invention is described by referring to FIGS. 1 to 6B with an example of a server.

Figure 1:
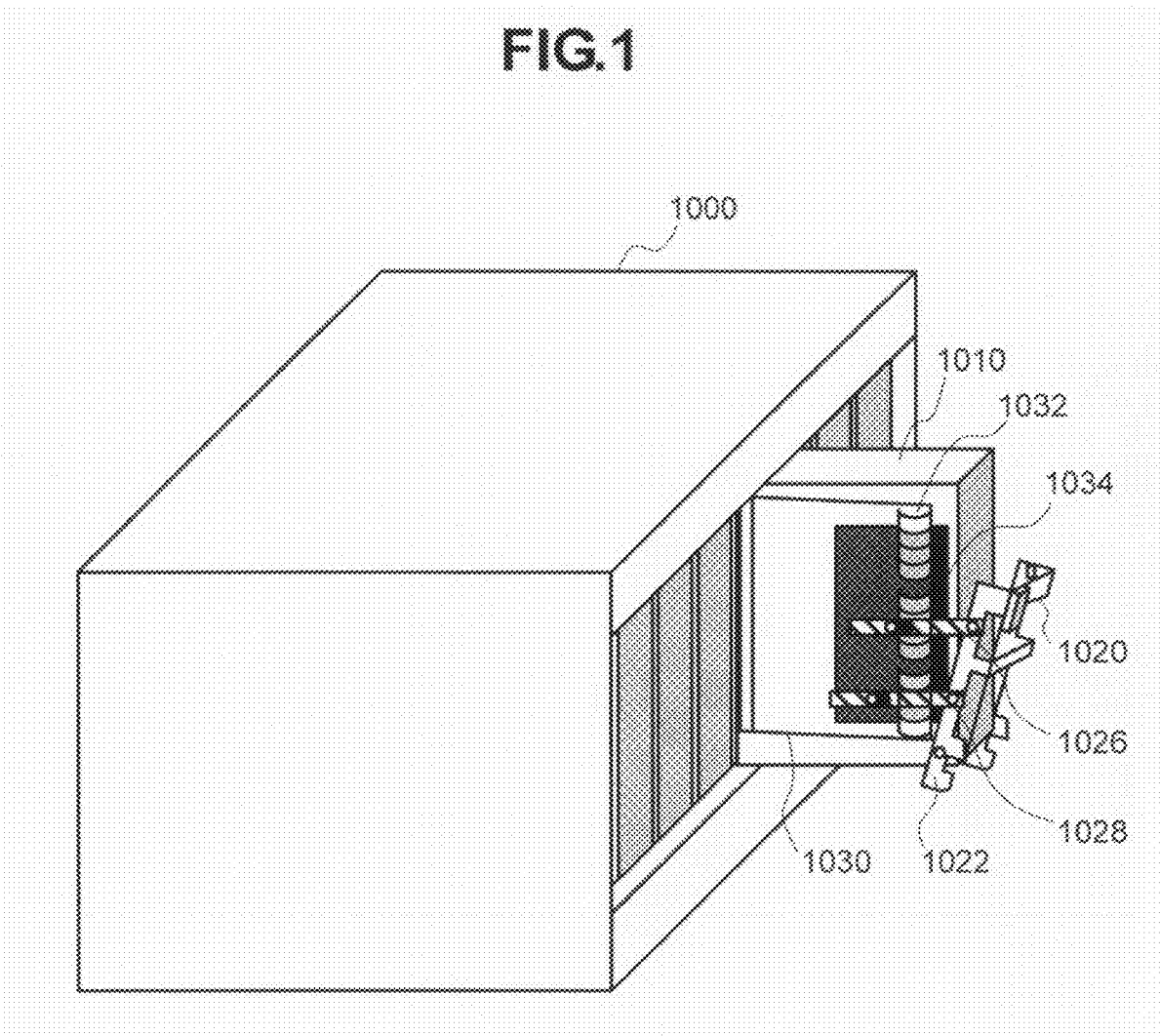
FIG. 1 is a diagram showing the configuration of a server device implementing the invention.

FIG. 1 is a schematic diagram showing the configuration of a server of the invention mounted with a RAID hard disk (HDD) array. In FIG. 1, a server chassis 1000 is so configured as to accommodate therein a canister 1010 with a hard disk housed therein. The canister 1010 is provided with an attachment/detachment mechanism 1020 for insertion/removal of the canister. The attachment/detachment mechanism 1020 is formed with a lug 1022 at the lower portion thereof for insertion into the body, attachment/detachment thereto/therefrom, and locking therewith. The canister 1010 is connected with a finger attachment plate 1030 that is conductive, has the spring characteristics, and is low in electrical resistance. This finger attachment plate 1030 is attached with a finger 1032 that is also conductive, has the spring characteristics, and is low in electrical resistance. Between the finger attachment plate 1030 and the canister 1010, a thickness adjustment plate 1034 is so sandwiched as to be able to move in the lateral direction on the surface of the canister 1010 attached with the finger, i.e., move forward and backward when viewed from the surface from which the canister is exposed. The thickness adjustment plate 1034 is fixed by the attachment/detachment mechanism 1020 and a pin using connection rods 1026 and 1028.

Figure 2:
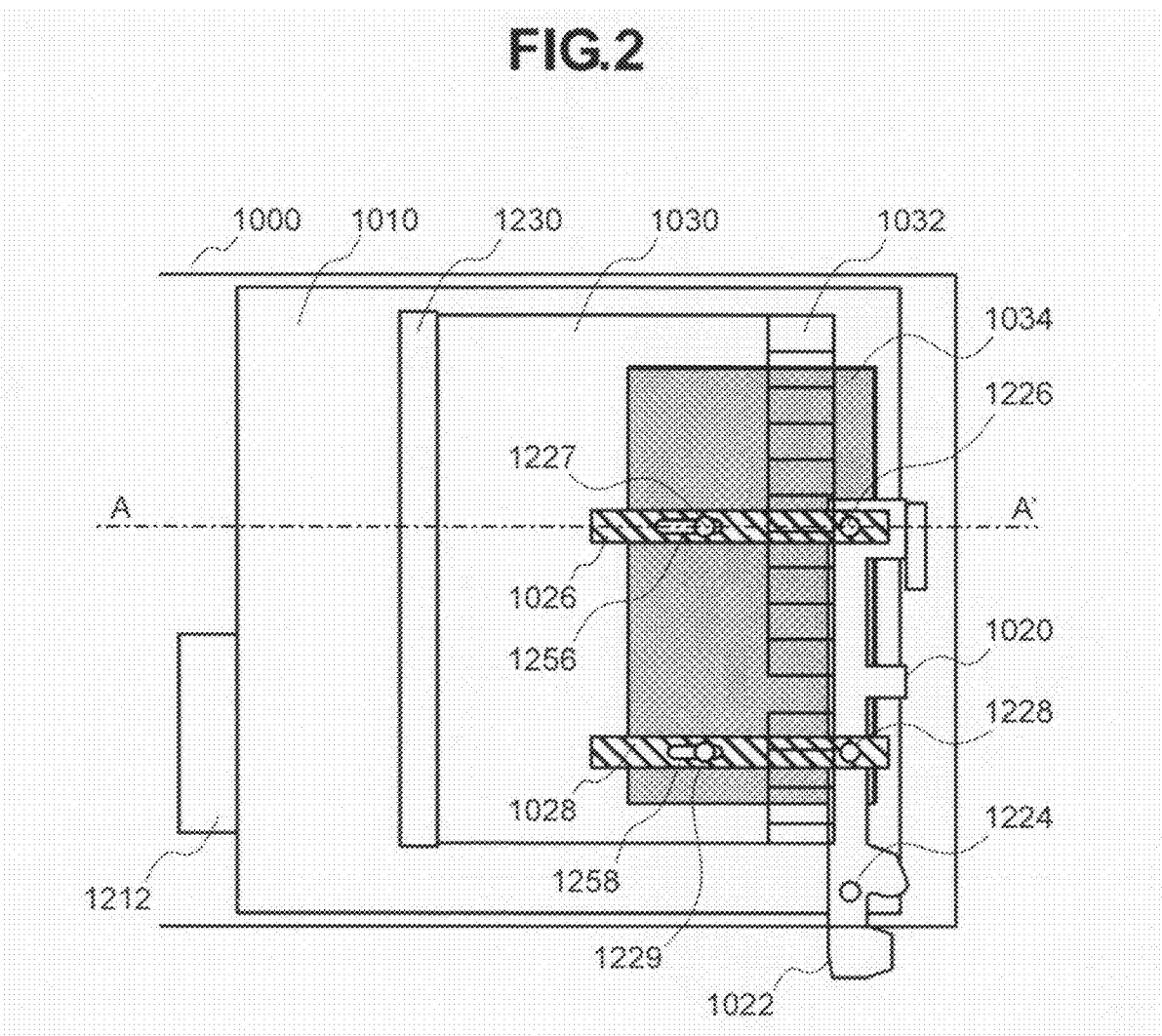
FIG. 2 is a diagram showing the configuration of a canister of the invention.

FIG. 2 shows the configuration of the canister 1010. The canister 1010 is provided with a connector 1212, and when the canister is inserted to the further depth, the canister 1010 is allowed to exchange electric signals with a platter attached to the server chassis 1000. The finger attachment plate 1030 is connected with the canister 1010 on one side 1230 thereof. The connection portion of the side 1230 is electrically low in impedance, and the finger attachment plate 1030 is connected with the canister 1010 with a low resistance. The other side of the finger attachment plate 1030 is attached with the conductive finger 1032. The finger 1032 is electrically connected to an adjacent canister or to the server chassis 1000 on the broad surface as a result of the portion of this finger being deformed.

The canister 1010 is attached with the attachment/detachment mechanism 1020 using a pivot pin 1224 for insertion/removal of the canister. This attachment/detachment mechanism 1020 is of the cantilever configuration by the pivot pin 1224, and can perform insertion/removal and locking with ease using a lug 1022. The attachment/detachment mechanism 1020 is attached with the two connection rods 1026 and 1028 using connection pins 1226 and 1228, respectively. When the attachment/detachment mechanism 1020 is tilted forward, i.e., when the canister is detached, the connection rods 1026 and 1028 are also moved forward, and when the attachment/detachment mechanism 1020 is moved backward to be back in position, i.e., when the canister is attached, the connection rods 1026 and 1028 are also moved backward. The connection rods 1026 and 1028 are respectively formed with oval-shaped holes 1256 and 1258, and are attached to the thickness adjustment plate 1034 by connection pins 1227 and 1229 being inserted through the holes, respectively. The size of the oval-shaped holes determines the movement amount of the thickness adjustment plate 1034 when the attachment/detachment mechanism 1020 is tilted, and by extension, adjusts the degree of opening and closing of the finger attachment plate 1030. Note here that this thickness adjustment plate 1034 is attached at the position sandwiched between the canister 1010 and the finger attachment plate 1030.

Figure 3:
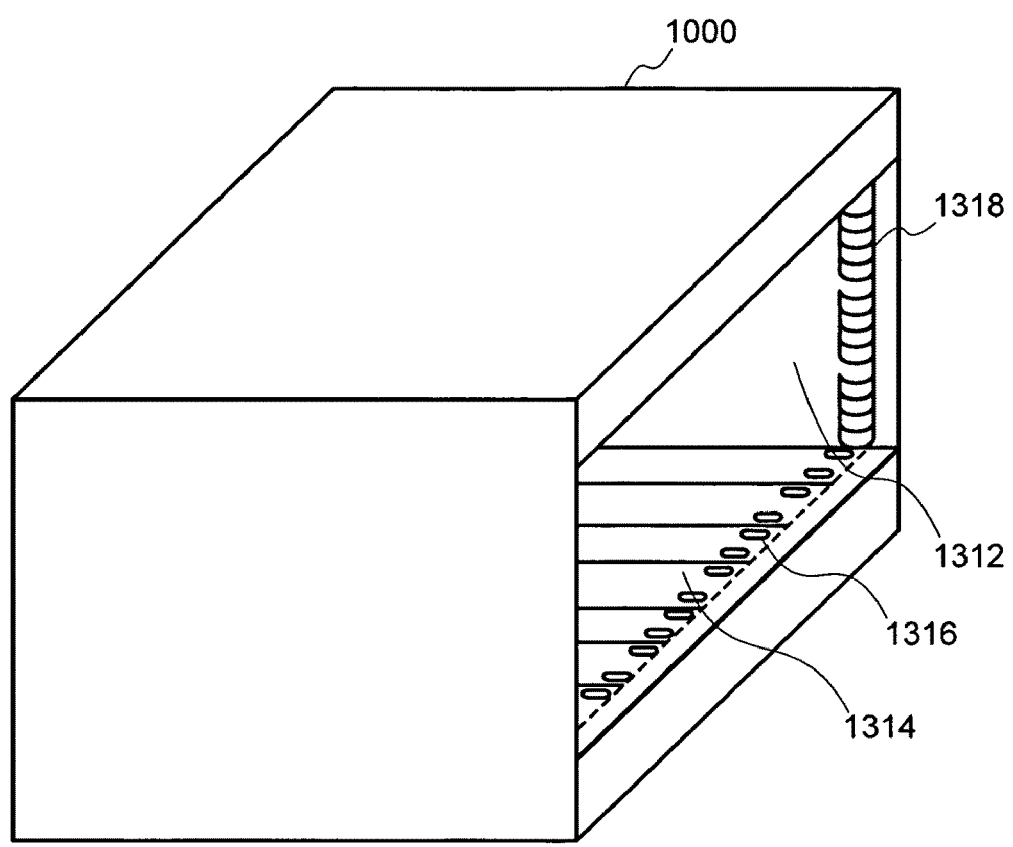
FIG. 3 is a diagram showing the configuration of a chassis of the main body of the server device.

FIG. 3 shows the configuration of the server chassis 1000. On the front surface of the chassis 1000, slots 1312 are formed for attachment of the eight canisters 1010 each for use with a hard disk. The slots are each attached with a guide 1314 for allowing individual insertion/removal of the canister 1010. The slots are each formed with a hole 1316 at the front portion thereof, and the hole 1316 is latched with the lug 1022 of the canister, thereby enabling insertion, attachment/detachment, and locking. The finger 1318 connected to the chassis establishes an electrical connection between the eighth canister 1010 and the server chassis 1000.

Figure 4A:
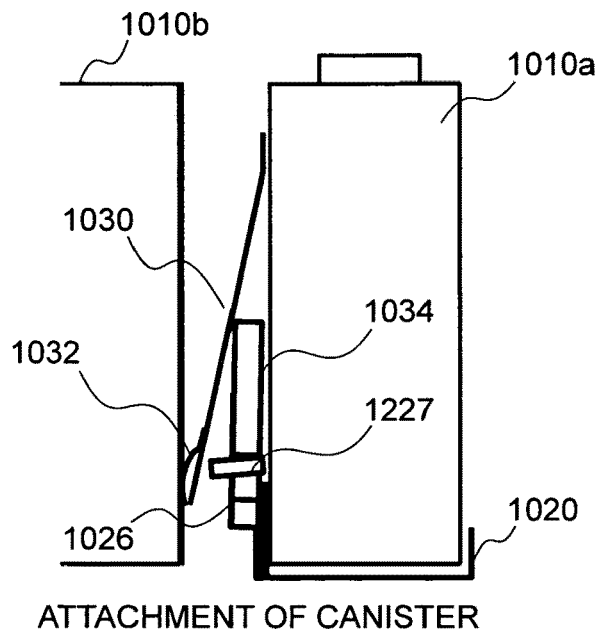
FIGS. 4A and 4B are each a diagram showing the mechanism of the canister of the invention.
Figure 4B:
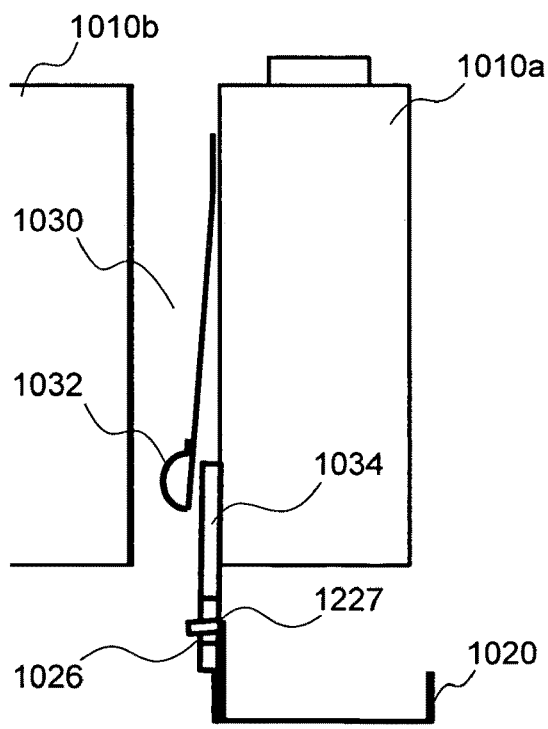

FIGS. 4A and 4B are each a diagram showing the operation of the attachment/detachment mechanism, and the state of opening/closing of the finger. FIGS. 4A and 4B each show a schematic cross-sectional view viewed from above of the canister of FIG. 2 cut along a line A-A'. FIG. 4A specifically shows the state in which the canister 1010 is attached to the server chassis 1000. The finger attachment plate 1030 is fixed to the canister 1010 on one side thereof. The finger attachment plate 1030 is bent to look like an inverted letter V, and into the space formed between the canister due to the bending, the thickness adjustment plate 1034 is inserted. The thickness adjustment plate 1034 is connected to the connection rod 1026 via the connection pin 1227, and then is connected to the attachment/detachment mechanism 1020, thereby configuring the crank mechanism. This accordingly changes the semicircular movement of the attachment/detachment mechanism 1020 into the forward-and-backward movement in the direction of insertion/removal. In the connection rod 1026, the hole for insertion of the connection pin 1227 is of an oval figure long in the forward-and-backward direction, thereby optimizing the amount of movement of the thickness adjustment plate 1034. In such a mechanism, the bent finger attachment plate 1030 can be changed in angle of opening/closure when the thickness adjustment plate 1034 moves in the forward-and-backward direction. In FIG. 4A example, by the thickness adjustment plate 1034 being pushed into the further depth, the opening angle between the finger attachment plate 1030 and the canister is increased so that the finger 1032 comes in contact with the adjacent canister with a high contact pressure. FIG. 4B shows the state at the time of detachment. As shown in FIG. 4B, because the attachment/detachment mechanism 1020 is pulled toward the front, the thickness adjustment plate 1034 follows the movement, i.e., is pulled out toward the front, so that the opening angle between the finger attachment plate 1030 and the canister is reduced. Accordingly, the contact pressure with the adjacent canister is reduced, or the finger 1032 does not come in contact with the adjacent canister, thereby being able to reduce the force at the time of detachment.

Figure 5:
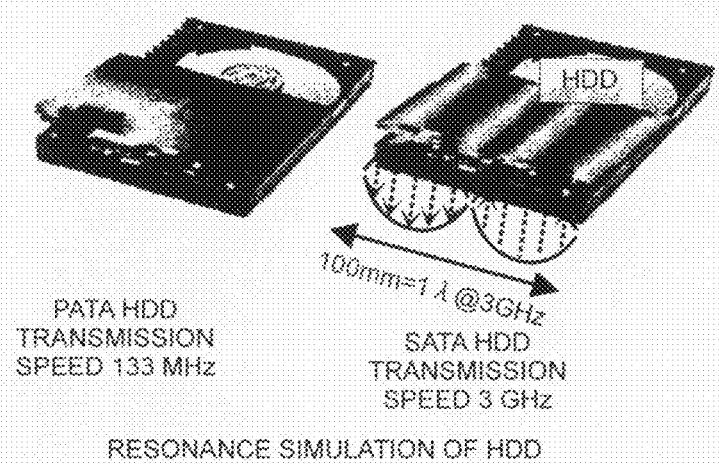
FIG. 5 shows the simulation result of HDD (Hard Disk Drive) resonance.
Figure 6A:
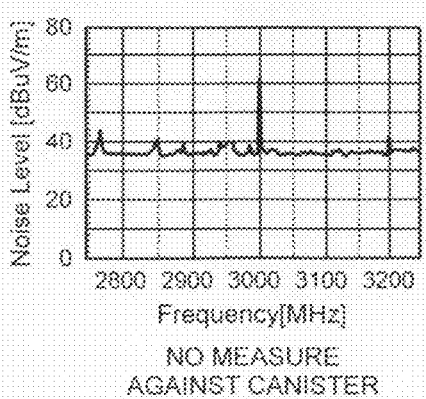
FIGS. 6A and 6B are each a noise spectrum of the 3m method used for measuring the effects of the invention.
Figure 6B:
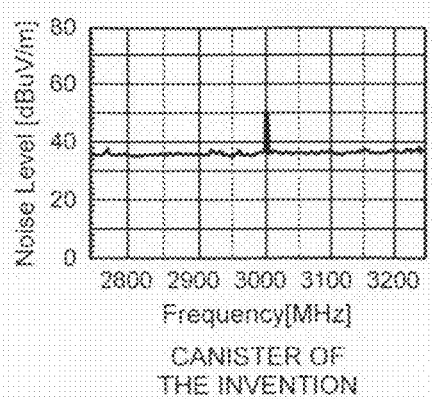

With a server mounted with a RAID hard disk (HDD) array to which the invention is applied, for example, transfer of the hard disk is sometimes performed by SATA (Serial Advanced Technology Attachment) or SAS interface (Serial-Attachment Small Computer System Interface). Such SATA and SAS interface are currently used for transmission at the high-speed 3 GHz. FIG. 5 shows the simulation result of the propagation distribution of an electromagnetic field when SATA interface signals are directed from a connector to the printed circuit mounted on a hard disk. When the signals are transmitted at 3 GHz, the electromagnetic waves have the wavelength of about 100 mm in the air. Because the wavelength is almost the same as the lateral length of the 3.5 hard disk, this causes such resonance of showing two intensive distribution of the electromagnetic field in the lateral length. When the chassis is in such a resonance state, the electromagnetic noise is considerably increased. FIGS. 6A and 6B each show the result of measurement of, with the 3m method, the radio field intensity of the server mounted with an RAID hard disk (HDD) array. FIG. 6A specifically shows the result of noise measurement in the state that the space around a canister is not filled. Similarly to the simulation result, if the space around the canister is not filled, the canister with a hard disk therein itself serves as an antenna, thereby emitting strong noise at 3 GHz. FIG. 6B shows the configuration of the invention, and shows the result of noise measurement in the state that the space around the canister is filled. Although noise emission of some level is observed, the effects of noise reduction of about 10 dB are achieved by the invention.

As such, with the configuration of changing the contact pressure of the finger-attachment jig for use to fill the space around the canister depending on whether the canister is attached or detached, attachment and detachment of the canister can be eased while keeping the effects of noise reduction.

Second Embodiment

A second embodiment of the invention is described by referring to FIGS. 7 and 8.

In the second embodiment, similarly to the first embodiment, exemplified is a canister with a hard disk housed therein. The second embodiment is of almost the same configuration as that of the first embodiment, but there is a difference of including a finger also at the upper and lower portions of the canister. The details of this difference will be described below.

FIG. 7 is a drawing showing the configuration of a canister, and FIG. 8 is a drawing showing the state in which a canister 2010 is mounted to a server. As shown in FIG. 7, in the invention, additionally to the configuration of the first embodiment, a finger 2032 and a finger attachment plate 2034 are provided also to a space portion on the upper surface of the canister, thereby filling the spaces at the upper and lower portions of the canister. In the invention, a thickness adjustment plate 2034 is so configured as to enclose the upper portion of the canister like a "letter of L", and is connected with the attachment/detachment mechanism 1020 with the crank mechanism using the connection rods 1026 and 1028. With such a configuration, the opening/closing angle of the finger 2032 at the upper portion of the canister is changed depending on whether the canister is attached or detached. The lower portion of the canister is also provided with a fixed finger 2036, and when the contact pressure is increased for the upper finger, the lower finger is responsively pushed against the lower portion of the chassis. With such a configuration of the second embodiment, the spaces in the four directions of the canister can be each filled with the finger of the sufficient contact pressure, thereby being able to suppress any possible noise. Note that, in the second embodiment, exemplified is the configuration of including the fingers both at the upper and lower space portions of the canister. This is surely not the only option, and the finger may be provided either to the upper or lower portion for space filling.

Third Embodiment

Figure 10A:
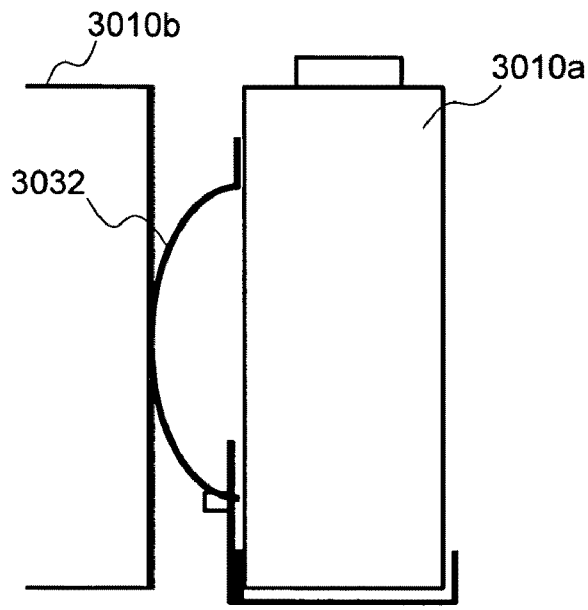
FIGS. 10A and 10B are each still another diagram showing the mechanism of the canister of the invention.
Figure 10B:
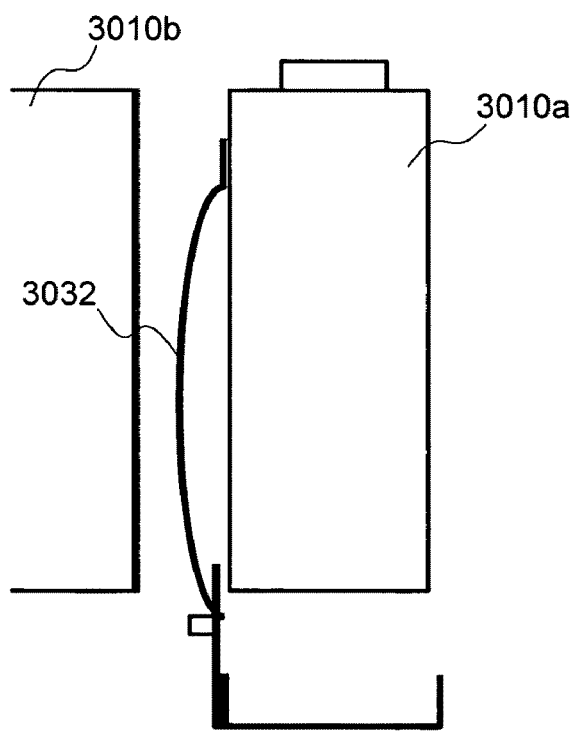

A third embodiment of the invention is described by referring to FIGS. 9 to 10B.

In this embodiment, as shown in FIG. 9, a finger board 3032 is shaped like an arc, and when the attachment/detachment mechanism 1020 is put in the circular movement, the arc diameter of the finger board 3032 shows a change, thereby changing the height of the arc of the finger. With the height of the arc changed as such, the contact pressure of the finger board 3032 with the canister adjacent thereto is changed. FIGS. 10A and 10B are each a cross-sectional view of the finger board of FIG. 9 cut along a line B-B', viewed from above of the canister. FIG. 10B shows the state in which the canister is detached. In such a state that an attachment/detachment lever 1020 is pulled forward, the arc-shaped finger board 3032 is also pulled toward the front, thereby reducing the height of the arc and also the contact pressure. Contrarily, as shown in FIG. 10A, when the attachment/detachment lever 1020 is pushed to fix a canister 3010 to the body, the arc-shaped finger board 3032 is pushed rearward, thereby reducing the arc diameter. In response thereto, the height of the arc is increased, and the contact pressure is increased.

As such, also in such a configuration of the second embodiment, the attachment/detachment of the canister can be eased by reducing the contact pressure at the time of detachment, and by increasing the contact pressure at the time of attachment, thereby favorably increasing the shielding characteristics with respect to any possible noise. Note that, in this embodiment, the finger is shaped like an arc. This is surely not restrictive, and even if the finger is shaped like an "inverted letter V", the similar effects can be achieved, and various other shape modifications are possible without departing from the scope of the invention.

According to the invention, at the time of insertion of a module, a finger is expanded in the direction vertical to the direction of insertion/removal, thereby filling the space between the module and another module. At the time of detachment of the module, the finger is compressed in the direction vertical to the direction of insertion/removal, thereby ensuring the space between the module and another module. As such, when an electronic device is activated with the module inserted therein, the shielding effects are exerted so that the measures against the EMC are taken, and for detachment of the module, the module can be pulled out with ease.

The invention is applicable to a chassis of an electrical device such as server storage device and personal computer, and the attachment configuration of a module for mounting of the electrical device to a chassis, especially a module of a printed circuit, a hard disk, a memory, or others.

The invention may be embodied in other specific forms without departing from the spirit or essential characteristics thereof. The present embodiment is therefore to be considered in all aspects as illustrative and not restrictive, the scope of the invention being indicated by the appended claims rather than by the foregoing description and all changes which come within the meaning and range of equivalency of the claims are therefore intended to be embraced therein.

The invention claimed is:

1. A module configuration, comprising:
   a canister;
   an attachment/detachment mechanism connected to the canister to be able to move forward and backward with respect to a first surface of the canister; and
   a first conductive member connected to a second surface of the canister adjacent to the first surface thereof, wherein
   the first conductive member is provided to at least partially move forward and backward with respect to the second surface in response to the attachment/detachment mechanism moving forward and backward with respect to the first surface; and
   a first member between the canister and the first conductive member, wherein
   the first member is connected to the attachment/detachment mechanism, and is provided to move forward and backward with respect to the first surface in response to the attachment/detachment mechanism moving forward and backward with respect to the first surface.

2. The module configuration according to claim 1, further comprising
   a second conductive member connected to a third surface that is adjacent to both the first and second surfaces of the canister.

3. The module configuration according to claim 2, further comprising
   a third conductive member connected to a fourth surface that is adjacent to both the first and second surfaces of the canister, and is different from the third surface.

4. The module configuration according to claim 1, wherein
   a part of the first conductive member is protruded to an underside of a surface opposing the canister.

5. The module configuration according to claim 1, wherein
   the first conductive member is connected also to the attachment/detachment mechanism.

6. The module configuration according to claim 5, wherein
   the first conductive member has a curved portion between a portion connected with the canister and a portion connected with the attachment/detachment mechanism.

7. An electronic device including a chassis carrying therein a plurality of module configurations, the module configurations each comprising:
   a canister;
   an attachment/detachment mechanism connected to the canister to be able to move forward and backward with respect to a first surface of the canister; and
   a first conductive member connected to a second surface of the canister adjacent to the first surface thereof, wherein
   the first conductive member is provided to come in contact with any of the module configurations adjacent thereto by at least partially moving forward and backward with respect to the second surface in response to the attachment/detachment mechanism moving forward and backward with respect to the first surface; and
   a first member between the canister and the first conductive member, wherein
   the first member is connected to the attachment/detachment mechanism, and is provided to move forward and backward with respect to the first surface in response to the attachment/detachment mechanism moving forward and backward with respect to the first surface.

8. The electronic device according to claim 7, further comprising
   a second conductive member provided to come in contact with the chassis through a connection with a third surface that is adjacent to both the first and second surfaces of the canister.

9. The electronic device according to claim 8, further comprising
   a third conductive member provided to come in contact with the chassis through a connection with a fourth surface that is adjacent to both the first and second surfaces of the canister, and is different from the third surface.

10. The electronic device according to claim 7, wherein
    a part of the first conductive member coming in contact with any of the module configurations adjacent thereto is protruded to an underside of a surface opposing the canister.

11. The electronic device according to claim 7, wherein
    the first conductive member is connected also to the attachment/detachment mechanism.

12. The electronic device according to claim 11, wherein
    the first conductive member has a curved portion between a portion connected with the canister and a portion connected with the attachment/detachment mechanism.

13. The electronic device according to claim 7, wherein
    the attachment/detachment mechanism is provided with a lug for engagement with a hole formed to the chassis.

14. The electronic device according to claim 7, wherein
    the electronic device is a server.

* * * * *